US010143116B2

(12) United States Patent
McCollum

(10) Patent No.: US 10,143,116 B2
(45) Date of Patent: Nov. 27, 2018

(54) OUTDOOR UPS UNIT SYSTEM AND METHOD

(71) Applicant: Toshiba International Corporation, Houston, TX (US)

(72) Inventor: William Lewis McCollum, Houston, TX (US)

(73) Assignee: Toshiba International Corporation, Houston, TX (US)

( * ) Notice: Subject to any disclaimer, the term of this patent is extended or adjusted under 35 U.S.C. 154(b) by 90 days.

(21) Appl. No.: 15/154,461

(22) Filed: May 13, 2016

(65) Prior Publication Data

US 2017/0332521 A1 Nov. 16, 2017

(51) Int. Cl.
*H05K 7/20* (2006.01)
*H01F 27/08* (2006.01)
*H02J 9/06* (2006.01)
*G06F 3/041* (2006.01)

(52) U.S. Cl.
CPC ......... *H05K 7/20909* (2013.01); *G06F 3/041* (2013.01); *H02J 9/061* (2013.01); *H05K 7/20572* (2013.01)

(58) Field of Classification Search
CPC ........... H05K 7/20909; H05K 7/20936; H05K 7/209; H05K 7/2089; H05K 5/0217; H05K 7/202; H05K 7/206; H05K 7/20609; H05K 7/20918; H02J 9/06; H02J 9/061; H02J 3/38; G06F 3/041; H01F 27/08–27/085
See application file for complete search history.

(56) References Cited

U.S. PATENT DOCUMENTS

| | | | | |
|---|---|---|---|---|
| 4,772,999 A * | 9/1988 | Fiorina | ........... | H02J 9/062 361/709 |
| 5,831,847 A * | 11/1998 | Love | ........... | H02M 3/00 361/695 |
| 6,046,921 A * | 4/2000 | Tracewell | ........... | H05K 7/20918 361/696 |
| 6,269,000 B1 * | 7/2001 | McCarrol | ........... | H02B 1/202 361/695 |
| 6,657,320 B1 * | 12/2003 | Andrews | ........... | H02J 9/066 307/47 |

(Continued)

FOREIGN PATENT DOCUMENTS

CA    1308801 C  * 10/1992  ............ H02B 1/565

*Primary Examiner* — Robert J Hoffberg
(74) *Attorney, Agent, or Firm* — Baker Botts L.L.P.

(57) ABSTRACT

In accordance with presently disclosed embodiments, an uninterruptable power supply (UPS) is provided. The UPS utilizes two chambers, one which is pneumatically sealed to house control electronics, and one that is not sealed that houses transformers. The pneumatically sealed compartment is cooled through a heat exchanger or air conditioner as well as through a heat sink. The chamber which houses the transformers is cooled by a fan which circulates air from outside the chamber through the chamber and out vents in a wall of the chamber. The UPS may utilizes a series of ducts to direct air flow into the chamber housing the transformers in such a way that the air enters the bottom of the chamber past the control electronics and through vents near the front of the chamber. The UPS may utilize a series of ducts to direct air flow past the heat sink attached to the pneumatically sealed chamber.

20 Claims, 4 Drawing Sheets

(56) References Cited

U.S. PATENT DOCUMENTS

| | | | | |
|---|---|---|---|---|
| 6,665,183 | B1 * | 12/2003 | Shikata | H05K 7/20918 |
| | | | | 257/721 |
| 6,742,583 | B2 * | 6/2004 | Tikka | H05K 7/206 |
| | | | | 165/261 |
| 7,312,993 | B2 * | 12/2007 | Bundza | H05K 7/206 |
| | | | | 165/104.33 |
| 7,816,631 | B2 * | 10/2010 | Cramer | H02M 7/003 |
| | | | | 219/632 |
| 8,233,278 | B2 * | 7/2012 | Hoffman | H05K 7/20909 |
| | | | | 165/122 |
| 8,462,505 | B2 * | 6/2013 | Nagami | B23K 9/1006 |
| | | | | 165/104.33 |
| 8,525,628 | B2 * | 9/2013 | Weber | H01F 27/08 |
| | | | | 336/55 |
| 8,872,077 | B2 * | 10/2014 | Gagas | H05B 6/1209 |
| | | | | 219/620 |
| 8,976,526 | B2 * | 3/2015 | Kulkarni | H02M 7/003 |
| | | | | 307/10.6 |
| 9,485,889 | B2 * | 11/2016 | Broussard | H05K 7/20509 |
| 9,974,214 | B2 * | 5/2018 | Hamari | H05K 7/206 |
| 2005/0257439 | A1 * | 11/2005 | Sarver | E04H 5/04 |
| | | | | 52/79.1 |
| 2013/0251163 | A1 * | 9/2013 | Adamson | H04R 3/12 |
| | | | | 381/58 |

* cited by examiner

OUTDOOR UPS UNIT SYSTEM AND METHOD

TECHNICAL FIELD

Embodiments of the present disclosure relate to outdoor uninterruptable power supplies, more particularly, to the systems and methods for cooling an outdoor uninterruptable power supply.

BACKGROUND

An uninterruptible power supply, well known as a UPS, is typically used as a buffer between commercially supplied power and an electrical load. Traditionally, a UPS comprises various electrical and magnetic components that require cooling. Thus, traditional outdoor UPS systems require two units, an external unit which is essentially a temperature control or cooling unit and an internal unit which carries out the functions of the UPS. These two unit systems are prone to failure as they require large A/C or cooling units to cool the UPS.

SUMMARY

In accordance with the above, presently disclosed embodiments are directed to an outdoor UPS that utilizes an integrated cooling system.

In some embodiments, the UPS comprises, two chambers and a compartment, a first chamber for housing control electronics, a second chamber for housing transformers, and a heat exchange compartment. The first chamber is pneumatically sealed, and the second chamber is not pneumatically sealed and has vents on a wall of the chamber. The heat exchange compartment comprises a heat exchanger or air conditioner which is in fluid communication with the first chamber such that the heat exchanger or air conditioner cools the first chamber. In such embodiments, the first chamber comprises a heat sink coupled to the control electronics such that the heat sink is configured to cool the control electronics. The second chamber is in fluid communication with a fan via a wall of the chamber wherein the fan circulates air through the chamber and out the vents on the wall of the chamber.

The aforementioned embodiments of the UPS is cooled in several ways. First, the control electronics are cooled by the heat sink. The heat sink operates to remove heat from the control electronics and disperse said heat to the outside environment. Second, the first chamber is cooled by the heat exchanger or air conditioner. The heat exchanger removes heat from the first chamber and disperses it to the outside environment. Third, the vent and fans in the second chamber circulate air through the second chamber. The air flows over the transformers and out the vents so as to remove heat from the transformers and subsequently transfer heat out the vents.

In some embodiments, the UPS additionally comprises a series of fans and ducts to cool the transformers and control electronics chambers. The duct and fans that cool the second chamber circulate air through an intake on top of the UPS, into a duct along the back of the second chamber, and into an opening at the bottom of the second chamber, so that the circulated air can cool the transformers. The duct and heat exchanger or air conditioner that cool the control electronics chamber circulate air through an intake on top of the first chamber, into a duct that runs along the heat sink coupled to the control electronics, and out the bottom of the duct so as to remove heat from the heat sink and the UPS.

BRIEF DESCRIPTION OF THE DRAWINGS

For a more complete understanding of the present disclosure and its features and advantages, reference is made to the following description, taken in conjunction with the accompanying drawings, in which.

DETAILED DESCRIPTION

Illustrative embodiments of the present disclosure are described in detail herein. In the interest of clarity, not all features of the actual implementation are described in this specification. It will of course be appreciated that in the development of any such embodiment, numerous implementation specific decisions must be made to achieve developers' specific goals, such as compliance with system related and business related constraints, which will vary from one implementation to another. Moreover, it will be appreciated that such a development effort might be complex and time consuming, but would nevertheless be a routine undertaking for those of ordinary skill in the art having the benefit of this disclosure. Furthermore, in no way should the following examples be read to limit or define the scope of the disclosure.

Figure 1:
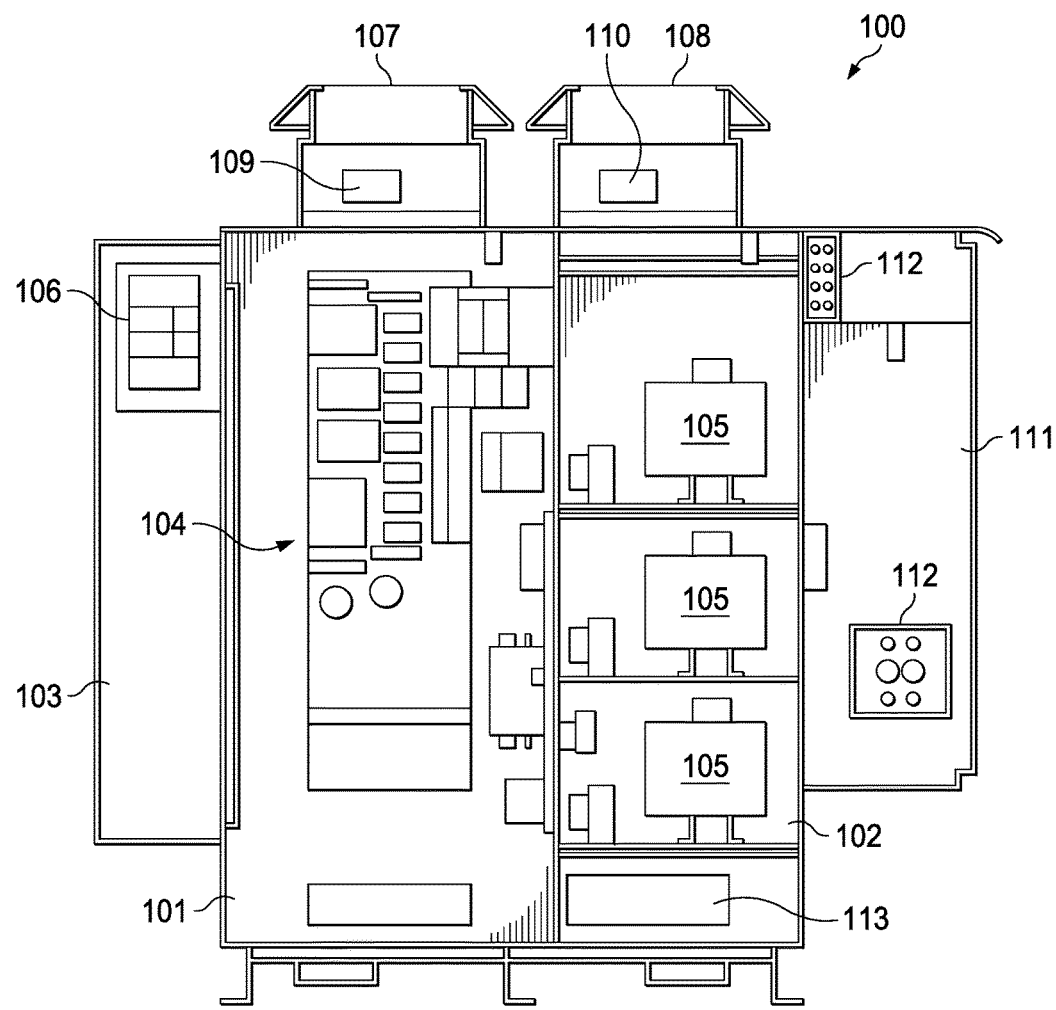
FIG. 1 is an illustrative front sectional view of an outdoor UPS, in accordance with an embodiment of the present disclosure.

Turning now to the drawings, FIG. 1 is an illustrative front view of an outdoor UPS 100. The UPS 100 includes a substantially pneumatically sealed control electronics chamber 101, a magnetics chamber 102, an input/output cabinet 111, and a heat exchange compartment 103. In some embodiments of the present disclosure, the UPS 100 comprises a NEMA 3R enclosure. NEMA 3R is a standard promulgated by the National Electrical Manufacturers Association. NEMA 3R enclosures are for either indoor or outdoor use and are typically made from stainless steel or painted steel to provide a degree of protection from weather elements (e.g., rain, sleet, snow, and ice). These enclosures are effectively waterproof. Furthermore, these enclosure protect personnel outside the enclosure from hazardous components within the enclosure. The chambers 101 and 102 are coupled and adjacent to one another, the heat exchange compartment 103 is adjacent and coupled to chamber 101, and the input/output cabinet 111 is adjacent and coupled to chamber 102.

The control electronics chamber 101 houses control electronics 104. The control electronics 104 may be coupled to the back wall of chamber 101. Generally, the magnetics chamber 102 houses transformers 105. The heat exchange compartment 103 houses a heat exchanger or air conditioner 106. In some embodiments, the heat exchanger or air conditioner may comprise one or more air conditioners or heaters. The heat exchanger or air conditioner 106 is coupled to the heat exchange compartment 103 in such a way that the heat exchanger or air conditioner 106 is also coupled to a wall of chamber 101. In some embodiments, the heat exchanger or air conditioner 106 will be in fluid communication with the control electronics chamber 101.

The UPS 100 may further comprise air intakes 107 and 108 at the top of UPS 100, used to cool chambers 101 and 102, wherein the air intakes 107 and 108 are coupled to chambers 101 and 102 respectively. The air intakes 107 and 108 house fans 109 and 110 to circulate air into the air intakes. The fans 109 and 110 are configured such that they facilitate air flow into the air intakes. The air circulated into intake 108 enters the chamber 102 via an opening 113 located near the bottom rear of the chamber 102.

The input/output cabinet 111 houses input and output connections 112. The input output connections typically connect the UPS to utility lines, and the output connections typically connect the UPS to an electrical appliance. In some embodiments, the cabinet 111 will house one or more sets of inputs for utility lines.

Figure 2:
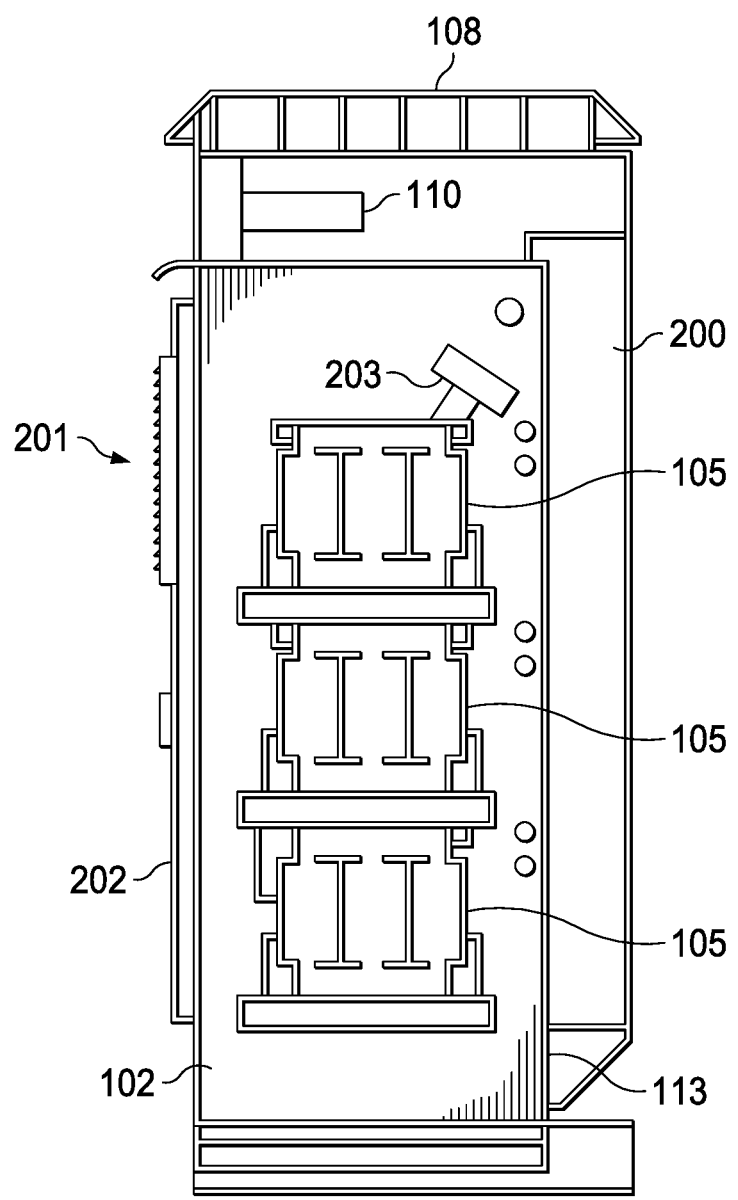
FIG. 2 is an illustrative side sectional view of the magnetics chamber of an outdoor UPS, in accordance with an embodiment of the present disclosure.

FIG. 2 is an illustrative section view of the magnetics chamber 102. The magnetics chamber 102 generally houses transformers 105. In some embodiments, the magnetics chamber 102 is coupled to an air intake 108, wherein the air intake is located at the top of the chamber 102. In some embodiments, the air intake houses a fan 110, which circulates air through the air intake. In some embodiments, the air intake is communicatively coupled to a duct 200. In some embodiments, the duct 200 is communicatively coupled to the magnetics chamber 102. The communicative coupling between the duct 200 and the magnetics chamber may be through an opening 113 near the rear bottom of the chamber 102. In some embodiments, one of the walls of the magnetics chamber is a door 202. The door 202 may be the wall of chamber 102 opposite the opening 113. Furthermore, the door 202 may be the wall of the chamber 102 that is not coupled to chamber 101 and that is not coupled to the input output compartment 111. In some embodiments, the door has a series of vents 201 which fluidically couples the chamber 102 to the outside. The vents may be located near the top of the door 202. In some embodiments, a fan 203 may be housed within chamber 102 so as to circulate air through the chamber and out vents 201. The fan 203 may be placed near the opening of duct 200 into chamber 102 such that the fan 203 circulates air exiting duct 200 through chamber 102.

Figure 3:
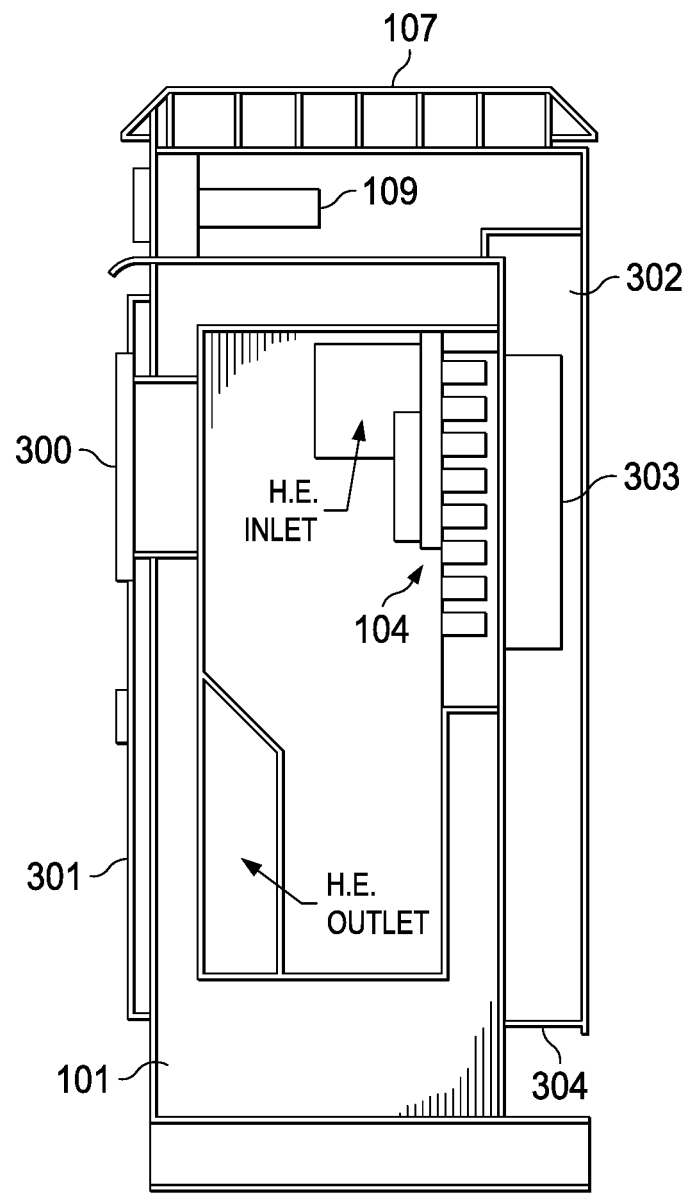
FIG. 3 is an illustrative side sectional view of the control electronics chamber of an outdoor UPS, in accordance with an embodiment of the present disclosure.

FIG. 3 is an illustrative sectional view of the control electronics chamber 101. The control electronics chamber 101 generally houses control electronics 104. In some embodiments the control electronics chamber is communicatively coupled to a heat sink 303, wherein the heat sink 303 is configured so as to draw heat away from the control electronics 104 and out of the chamber 101 through the heat exchanger or air conditioner 106 (FIG. 1).

In some embodiments, the control electronics chamber 101 is coupled to an air intake 107. In some embodiments, the air intake houses a fan 109, which circulates air through the air intake 107. In some embodiments, the air intake 107 is communicatively coupled to duct 302. In some embodiments, the duct 302 is coupled to the electronics control chamber 101. In some embodiments, the duct 302 is coupled with the heat sink 303. In some embodiments, the duct 302 comprises an exhaust 304 at one terminal end. The exhaust 304 may be placed near the bottom of chamber 101. In some embodiments, the fan 109 circulates air through the air intake 107, through the duct 302, past the heat sink 303, and out the exhaust 304.

In some embodiments, the control electronics chamber 101 consists of a pneumatically sealed door 301. The door 301 may be opposite the wall which the heat sink 303 is coupled. In some embodiments, a touch screen or a human machine interface (HMI) screen 300 is coupled to the exterior of the door 301. In some embodiments, the touch or HMI screen 300 allows a user to control any UPS device in a facility.

Figure 4:
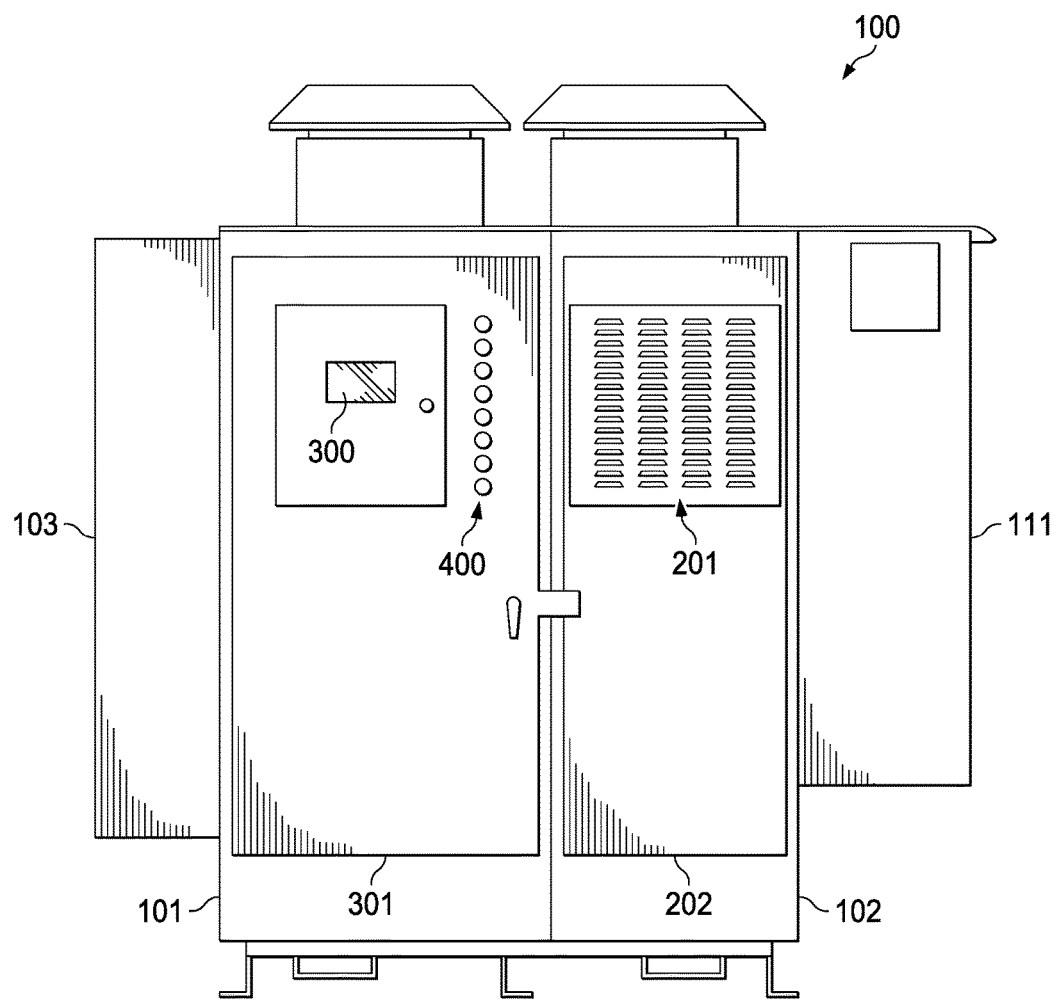
FIG. 4 is a front perspective view of an outdoor UPS, in accordance with an embodiment of the present disclosure.

FIG. 4 is a perspective view of an outdoor UPS 100. In some embodiments, the UPS 100 includes a substantially pneumatically sealed control electronics chamber 101, a magnetics chamber 102, an input/output cabinet 111, and a heat exchange compartment 103. Generally the chambers 101 and 102 are coupled, the heat exchange compartment 103 is coupled with chamber 101, and the input/output cabinet 111 is coupled with chamber 102. Chamber 101 may comprise on its exterior a touch screen or HMI screen 300 which allows a user to control any UPS device in a facility.

Chambers 101 and 102 may additionally comprise doors 301 and 202. Door 301 is a pneumatically sealed door so as to maintain the substantially pneumatically sealed environment of chamber 101. Door 202 may comprise vents 201 to allow air to flow from inside chamber 102 to out of chamber 102. In some embodiments, the HMI screen 300 may be placed on the exterior of 301.

In some embodiments, the UPS 100 may comprise a set of lights 400. Lights 400, function so as to indicate the status of the UPS. Lights 400 may comprise lights of different colors indicating different statuses of the UPS so that an operator may look at the UPS from a distance to determine its status.

The overall cooling of the UPS 100 can be viewed as the combined cooling of chambers 101 and 102. The electronics chamber and its various components are cooled in several ways. First, the control electronics chamber 101 is cooled by a heat exchanger or air conditioner 106, which draws heat out of compartment 101 and disperses it into the outside environment. Second, the control electronics 104 within chamber 101 are cooled by the heat sink 303, as the heat sink is configured such that it draws heat away from the control electronics. Third, the heat sink 303 is cooled by the air flow from fan 109 that circulates through air intake 107, duct 302, and out exhaust 304, by dispersing the heat from heat sink 303 into the outside environment.

The magnetics chamber 102 is cooled in primarily one way. The magnetics chamber is cooled by a single air flow that begins with the air being circulated into the air intakes 108 by fan 110. Fan 110 then circulates air through duct 200 into chamber 102 through the opening 113. Once inside chamber 102, the air is then circulated by fan 203. The air then is circulated past the transformers 105 and out the vents 201. This air flow draws air into the chamber 102, removes excess heat from the transformers 105, and disperses the heat into the outside environment via vents 201.

Although the present disclosure and its advantages have been described in detail, it should be understood that various changes, substitutions and alterations can be made herein without departing from the spirit and scope of the disclosure as defined by the following claims.

What is claimed is:
1. An uninterruptable power supply (UPS) comprising:
a heat exchange compartment comprising a heat exchanger;
a first chamber that is pneumatically isolated from an environment outside of the UPS, wherein the first chamber houses control electronics and a first portion of a heat sink, wherein the first chamber is in fluid communication with the heat exchange compartment via a first wall of the first chamber so as to cool the first chamber, and wherein the heat sink is coupled to the control electronics and a second wall of the first chamber so as to cool the control electronics; and a second chamber housing one or more transformers, said second chamber is in fluid communication with a first fan via a first wall of the second chamber, wherein one or more other walls of the second chamber comprise vents to facilitate circulation of a first flow of air blown by the first fan through the second chamber.

2. The UPS of claim 1 wherein the UPS comprises a housing and wherein the housing comprises stainless or painted steel and wherein the housing is waterproof.

3. The UPS of claim 1 wherein the heat exchange compartment further comprises a heater.

4. The UPS of claim 1 wherein the UPS further comprises a duct coupled with a second portion of the heat sink, and a second fan in fluid communication with the duct, such that the second fan circulates a second flow of the air through the duct and removes heat from the second portion of the heat sink.

5. The UPS of claim 1 wherein the UPS further comprises a touch screen or an HMI Screen located on an exterior surface of the UPS, wherein the touch screen or the HMI Screen allows an operator to control multiple UPS's in a facility, the UPS being one of the multiple UPS's.

6. The UPS of claim 1 wherein the UPS further comprises a set of lights on an exterior of the UPS that indicate a status and an operation of the UPS.

7. The UPS of claim 1 wherein the UPS comprises double inputs for utility lines.

8. The UPS of claim 1 wherein the UPS comprises an Input/Output box on an exterior surface, the Input/Output box comprises inputs for utilities.

9. A method of cooling an uninterruptable power supply (UPS) comprising:
   housing a heat exchanger or an air conditioner in a heat exchange compartment;
   housing control electronics and a first portion of a heat sink in a first chamber wherein the first chamber is pneumatically isolated from an environment outside of the UPS;
   placing the first chamber in fluid communication with the heat exchanger or the air conditioner;
   housing one or more transformers in a second chamber;
   placing the second chamber adjacent to the first chamber;
   circulating a first flow of outside air though the second chamber using a first fan, and a vent located on a wall of the second chamber;
   cooling the first chamber via the heat sink; and
   cooling the first chamber via the heat exchanger or the air conditioner.

10. The method of claim 9 further comprising placing the UPS in a housing comprised of stainless or painted steel wherein the housing is waterproof.

11. The method of claim 9 further comprising:
    attaching a first duct to a second portion of the heat sink wherein the duct has an intake and an exhaust;
    attaching the first duct to the first chamber;
    placing a second fan in fluid communication with the first duct; and
    circulating a second flow of the outside air through the duct so as to remove heat from the heat sink.

12. The method of claim 9 further comprising housing a heater in the heat exchanger compartment.

13. The method of claim 9 further comprising placing a touch screen or an HMI Screen located on an exterior surface of the UPS, wherein the touch screen or the HMI Screen allows an operator to control multiple UPS's in a facility, the UPS being one of the multiple UPS's.

14. The method of claim 9 further comprising placing a set of lights on an exterior of the UPS that indicate a status and an operation of the UPS.

15. An uninterruptable power supply (UPS) comprising:
    a heat exchange compartment comprising a heat exchanger;
    a first chamber that is pneumatically isolated from an environment outside of the UPS, wherein the first chamber houses control electronics and a first portion of a heat sink, wherein the first chamber is in fluid communication with the heat exchange compartment via a first wall of the first chamber so as to cool the first chamber, and wherein the heat sink is configured to cool the control electronics; and
    a second chamber housing one or more transformers wherein said second chamber is in fluid communication with a first fan via a first wall of the second chamber, wherein one or more other walls of the second chamber comprise vents to facilitate circulation of a first flow of outside air;
    a second fan within the second chamber wherein the second fan circulates the first flow of the air through the second chamber past the transformers so as to cool the transformers and out the vents in the one or more other walls of the second chamber;
    a first duct comprising a first air intake and a first exhaust wherein the first duct is attached to a top and a back of the first chamber and wherein the duct is coupled to a second portion of the heat sink;
    a third fan in fluid communication with the first duct so as to cool the heat sink by circulating a second flow of the outside air through the duct wherein the second flow of the air travels through the first intake, over the second portion of the heat sink, and through the first exhaust; and
    a second duct comprising a second air intake wherein the second duct is attached to the second chamber wherein the second duct is attached to a top and a back of the second chamber and wherein the second duct is in fluid communication with the second chamber;
    wherein the first fan and the second fan are in fluid communication with the second duct so as to cool the second chamber by circulating the first flow of the outside air through the second air intake into the second duct, and into the second chamber.

16. The UPS of claim 15 wherein the UPS comprises a housing wherein the housing comprises stainless or painted steel and is waterproof.

17. The UPS of claim 15 wherein the UPS further comprises a touch screen or an HMI Screen located on an exterior surface of the UPS, wherein the touch screen or the HMI Screen allows an operator to control multiple UPS's in a facility, the UPS being one of the multiple UPS's.

18. The UPS of claim 15 wherein the heat exchange compartment further comprises a heater.

19. The UPS of claim 15 wherein the UPS further comprises a set of lights on an exterior of the UPS that indicate a status and an operation of the UPS.

20. The UPS of claim 15 wherein the UPS comprises an Input/Output box on an exterior surface, the Input/Output box comprises inputs for utilities.

* * * * *